United States Patent
Kishore et al.

(10) Patent No.: US 12,482,719 B2
(45) Date of Patent: Nov. 25, 2025

(54) LOW-STRESS THERMAL INTERFACE

(71) Applicant: NXP USA, Inc., Austin, TX (US)

(72) Inventors: Sharan Kishore, Tempe, AZ (US); Lu Li, Gilbert, AZ (US); Jaynal A Molla, Gilbert, AZ (US); Fui Yee Lim, Sunway SPK (MY); Freek Egbert van Straten, Mook (NL); Lakshminarayan Viswanathan, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 471 days.

(21) Appl. No.: 18/146,712

(22) Filed: Dec. 27, 2022

(65) Prior Publication Data
US 2024/0213114 A1    Jun. 27, 2024

(51) Int. Cl.
*H01L 23/373* (2006.01)
*H01L 23/00* (2006.01)

(52) U.S. Cl.
CPC .......... *H01L 23/3735* (2013.01); *H01L 24/29* (2013.01); *H01L 24/32* (2013.01);
(Continued)

(58) Field of Classification Search
CPC . H01L 24/29; H01L 23/3736; H01L 23/3733; H01L 23/3735; H01L 23/3732; H01L 24/32; H01L 24/83; H01L 23/3738; H01L 23/3121; H01L 23/49513; H01L 23/562; H01L 23/482; H01L 21/4867; H01L 23/473; H01L 25/072; H01L 24/92; H01L 24/73; H01L 23/49811; H01L 23/5384; H01L 2224/8384; H01L 2224/32245; H01L 2224/29139; H01L 2224/81005; H01L 2224/83874; H01L 2224/73204; H01L 2225/1058; H01L 2224/32225; H01L 2224/83862; H01L 2924/1434; H01L 2224/16225; H01L 2924/1815; H01L 2224/73253; H01L 2224/92125; H01L 2224/97;
(Continued)

(56) References Cited

U.S. PATENT DOCUMENTS 10,825,759 B2    11/2020   Hong et al.
11,101,246 B2    8/2021    Iwashige et al.
(Continued)

OTHER PUBLICATIONS

Seiss, M. et al.; "The Interface in Molybdenum-copper-composites used for Thermal Management Applications"; IEEE Thermal Measurement, Modeling & Management Symposium, San Jose, CA, USA; 6 pages (Mar. 2017).
(Continued)

*Primary Examiner* — Mouloucoulaye Inoussa (57) ABSTRACT

A substrate is bonded to a conductive metallic flange via a free-standing heterostructure thermal interface material that includes physically distinct volumes of different conductive materials. The heterostructure thermal interface material (a bimetallic foil, for example) is metallurgically bonded to the bottom of the substrate on one side and metallurgically bonded to the flange on an opposite side. The constituent materials forming the thermal interface material and their dimensions can be chosen to achieve a desired thermal and/or electrical conductivity while allowing the coefficient of thermal expansion (CTE) to be matched to the substrate and/or the flange.

26 Claims, 3 Drawing Sheets

(52) U.S. Cl.
CPC ............... *H01L 2224/29139* (2013.01); *H01L 2224/32245* (2013.01)

(58) Field of Classification Search
CPC .... H05K 3/1291; H05K 1/0207; H05K 3/328; H05K 1/0272; H05K 1/145; H05K 1/0204; H05K 1/181; H05K 1/0259; H05K 2201/10166; H05K 2201/10015; H05K 2201/10545; H01G 4/38; H01G 4/224; H01G 4/228; H01G 2/065; H01G 4/30; H01G 2/06; H10D 62/8325; H10D 62/8503

See application file for complete search history.

(56) References Cited

U.S. PATENT DOCUMENTS

| | | | | |
|---|---|---|---|---|
| 2006/0249824 | A1* | 11/2006 | Lee | H03H 9/1078 257/678 |
| 2007/0230130 | A1* | 10/2007 | Alcoe | H01L 23/3735 257/E23.09 |
| 2008/0023665 | A1 | 1/2008 | Weiser et al. | |
| 2008/0284047 | A1* | 11/2008 | Tosaya | H01L 23/10 257/E23.116 |
| 2010/0237496 | A1* | 9/2010 | Touzelbaev | H01L 23/42 438/122 |
| 2010/0327430 | A1* | 12/2010 | Jadhav | H01L 23/3735 165/185 |
| 2010/0327431 | A1* | 12/2010 | Touzelbaev | H01L 23/367 228/208 |
| 2011/0147916 | A1* | 6/2011 | Su | H01L 23/433 257/692 |
| 2012/0043668 | A1* | 2/2012 | Refai-Ahmed | H01L 23/42 438/109 |
| 2012/0061852 | A1* | 3/2012 | Su | H01L 23/3128 257/734 |
| 2013/0258599 | A1* | 10/2013 | Danello | H01L 23/433 361/706 |
| 2014/0246770 | A1* | 9/2014 | Jha | H01L 24/13 428/221 |
| 2016/0133602 | A1* | 5/2016 | Chen | H01L 23/3128 438/107 |
| 2016/0329261 | A1 | 11/2016 | Hung et al. | |
| 2016/0358884 | A1* | 12/2016 | Cavasin | H01L 24/27 |
| 2017/0125375 | A1* | 5/2017 | Chinnusamy | H01L 21/486 |
| 2018/0158749 | A1* | 6/2018 | Yu | H01L 25/18 |
| 2019/0348340 | A1* | 11/2019 | Kwon | H01L 23/3737 |
| 2020/0066612 | A1* | 2/2020 | Hung | H01L 23/055 |
| 2020/0126882 | A1* | 4/2020 | Jang | H01L 23/49816 |
| 2020/0185300 | A1* | 6/2020 | Xu | H01L 23/5385 |
| 2020/0286806 | A1* | 9/2020 | Nofen | F28F 21/085 |
| 2021/0041182 | A1* | 2/2021 | Eid | H01L 23/3672 |
| 2021/0202348 | A1* | 7/2021 | Arrington | H01L 21/4882 |
| 2021/0225729 | A1* | 7/2021 | Bozorg-Grayeli | H01L 21/4853 |
| 2021/0249375 | A1* | 8/2021 | Eid | H01L 24/29 |
| 2021/0254910 | A1* | 8/2021 | Lee | H01L 23/3675 |
| 2021/0265238 | A1* | 8/2021 | Tejeda Ferrari | H01L 23/3737 |
| 2021/0384167 | A1 | 12/2021 | Ye et al. | |
| 2021/0398874 | A1 | 12/2021 | Cheng et al. | |
| 2022/0102234 | A1* | 3/2022 | Das Mahapatra | H01L 23/36 |
| 2022/0216124 | A1 | 7/2022 | He et al. | |
| 2022/0310470 | A1* | 9/2022 | Chen | H10D 88/00 |
| 2022/0384307 | A1* | 12/2022 | Li | H01L 23/3735 |
| 2024/0096736 | A1* | 3/2024 | Shin | H01L 21/4882 |

OTHER PUBLICATIONS

Sugiura, Kazuhiko et al.; "Reliability Evaluation of SiC Power Module with Sintered Ag Die Attach and Stress-Relaxation Structure"; IEEE Trans on Components, Packaging and Manufacturing Tech, vol. 9, No. 4; 7 pages (Apr. 2019).

* cited by examiner

LOW-STRESS THERMAL INTERFACE

FIELD OF THE INVENTION

Embodiments of the subject matter described herein relate to thermal interface materials used in semiconductor packaging.

BACKGROUND OF THE INVENTION

High-power semiconductor devices and other electronic devices are frequently assembled into packages to protect the devices from damage and to provide macroscopic electrical contacts. Packages can be made of various materials including polymers and ceramics. Often the package will contain a flange or other metallic structure to which components are bonded. Such flanges can serve simultaneously as a backside contact to a semiconductor die and as a heat-dissipation structure which may be coupled to an external heatsink or other cooling apparatus.

SUMMARY OF THE INVENTION

In an example embodiment a method includes receiving a semiconductor substrate having a top surface and a bottom surface; metallurgically bonding a top surface of a freestanding heterostructure thermal interface material to the bottom surface of the semiconductor substrate; and coupling the semiconductor substrate to a metallic flange. The metallic flange has a top surface disposed beneath the semiconductor device die and the substrate is coupled to the flange by metallurgically bonding a bottom surface of the heterostructure thermal interface material to the metallic flange via a layer of die-attach material. The heterostructure thermal interface comprises a volume of a first conductive material and a volume of second conductive material that is physically distinct from the first volume of conductive material.

In another example embodiment, a device includes: a semiconductor substrate having a top surface and a bottom surface; a heterostructure thermal interface material metallurgically bonded to the bottom surface of the semiconductor substrate; and a metallic flange having a top surface disposed beneath the semiconductor substrate that is metallurgically bonded to a bottom surface of the heterostructure thermal interface material via a layer of die-attach material. The heterostructure thermal interface comprises a volume of a first conductive material and a volume of second conductive material that is physically distinct from the first volume of conductive material.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are non-limiting examples of suitable processes according to embodiments and are for the purposes of illustration. Systems and devices according to embodiments herein may be use any suitable processes including those that omit steps described above, perform those steps and similar steps in different orders, and the like. It will also be appreciated that well-known features may be omitted for clarity.

Unless explicitly stated otherwise, the use of terms "approximately," "substantially" and similar terms in connection with dimensions, relative positioning, or orientation of various features indicates that the dimensions, positioning, or orientation of those features are subject to tolerances and/or expected process variations of equipment and processes chosen to form the described features. Unless explicitly stated otherwise, the use of terms "approximately," "substantially" and similar terms in connection measurable values or characteristics is subject to the expected measurement accuracy of equipment and methods used to measure those values or characteristics and/or within tolerance limits specified by technical standards applicable to the technologies described.

High-power semiconductor devices are frequently assembled into packages that contain a metallic flange, or comparable structures such as a metallic "coin" or a metallic leadframe (in the context of this disclosure any of these structures may be described as a flange"). Such a semiconductor device may have a back surface that is metallized and subsequently bonded to the flange in order to provide a path to remove heat from the device and dissipate that heat into the environment surrounding the package. Generally, it is desirable that the semiconductor substrate is intimately bonded to the flange and that the flange has a high thermal conductivity value. However, problems may arise if the flange has a coefficient of thermal expansion ("CTE") that differs significantly from the semiconductor device and/or die attach material used to bond the device to the flange, as this can result in mechanical stresses as the package warms and cools due to differing rates of expansion or contracting between the die and the flange. Such stresses can result in damage to the device or undesired performance degradation.

Accordingly, embodiments herein utilize heterostructure thermal interface materials that enable effective heat transfer between a semiconductor device and a conductive flange while reducing the likelihood of damage to the device or the package or other undesirable effects due to mismatched CTE values between the device and the flange, such as failure of the die attach material used to bond the device to the flange.

Figure 1A:
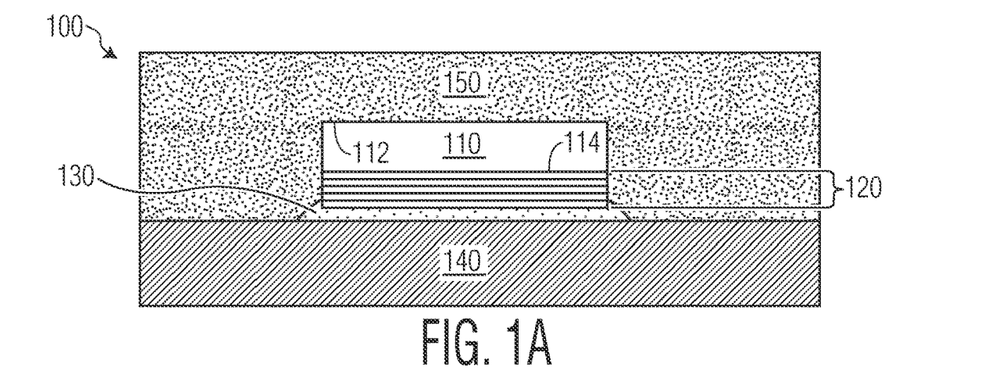
FIG. 1A is a cross-sectional illustration of a semiconductor package that includes a heterostructure-based thermal interface according to one or more embodiments.

FIG. 1A shows a cross-section of an example package according to one or more embodiments. The package 100 includes a device die 110 having a top surface 112 and a bottom surface 114. The bottom surface 114 of the die 110 is bonded to a conductive flange 140 via a heterostructure thermal interface material (a TIM 120) formed from at least two volumes of material that have a different composition from each other and are physically distinct from each other. The device die 110 may be any suitable die or other component including, but not limited to, semiconductor device die formed from silicon, silicon carbide (SiC), gallium nitride (GaN), and gallium nitride formed on silicon or silicon carbide. As shown, a first surface of the TIM 120 is metallurgically bonded to the bottom surface 114 of the semiconductor die 110. The other side of the TIM 120 is in turn metallurgically bonded to the surface of the flange 140 beneath the die 110 using a die-attach material 130. The device die 110 and other structures are then molded within a volume of molding material 150 to complete the package.

Figure 2:
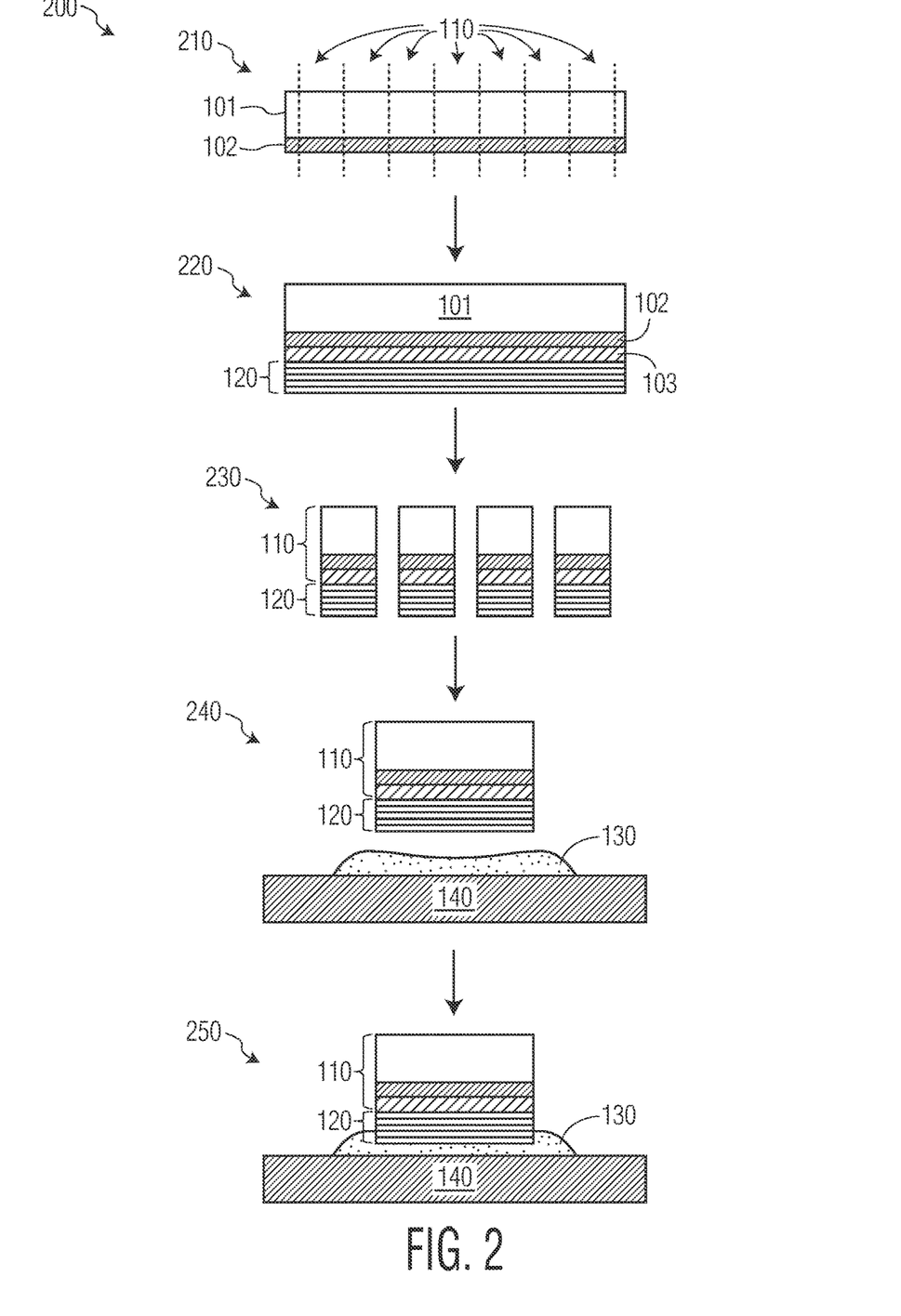
FIG. 2 is a cross-sectional illustration steps in an example process suitable for use in assembling the semiconductor package of FIG. 1A according to one or more embodiments.

In one or more embodiments a die such as the die 110 includes a backside metallization layer (e.g., the backside metallization layer 102 depicted in FIG. 2). In one or more embodiments a die attach material such as the die attach material 130 is a material configured for use in a sintering process (sometimes referred to as a sinter, a sinter paste; a sintering material, or the like; the resultant bond may be referred to as "sintered"), including a sinter paste, a sinter powder, or a sinter film as nonlimiting examples. In one or more embodiments a TIM such as the TIM 120 is bonded to a die such as the die 110 using a die-attach material such as the die-attach material 130 or another suitable die attach material. In one or more embodiments, the die-attach material is a silver-based sintering material. In one or more embodiments, the die attach-material is a copper-based sintering material.

It will be understood that a sintered die attach material is one configured such that individual particles of the material coalesce as the material is heated at a temperature below the melting point of the material, without melting of the bulk of the particles. It will be understood that such a sintering process will produce a metallurgical bond between two surfaces being sintered together and that this sintered bond will have a microstructure that is characteristic of the kinetics of sintering processes which are distinct from other bonding processes such as soldering. As one example, it is well-known, that soldering involves melting of a die attach material (i.e., the solder or "soldering material") and cooling the liquid-phase material until it returns to the solid state. Nonlimiting examples of suitable sintering materials for use in one or more embodiments include powders, films, and pastes composed of silver and/or copper.

Figure 1B:
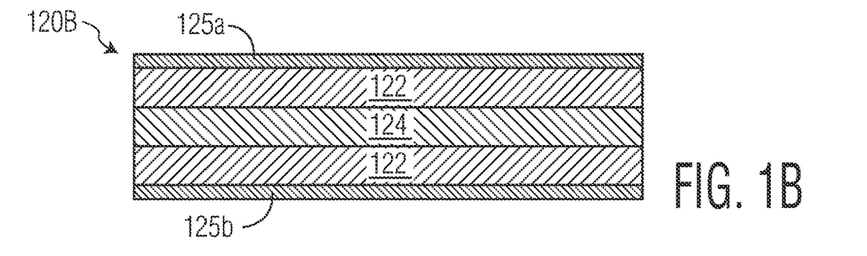
FIG. 1B is a cross-sectional illustration of a heterostructure-based thermal interface suitable for use in one or more embodiments.

FIG. 1B is a cross-sectional illustration of an example free-standing TIM 120B suitable for use as the TIM 120 in the example of FIG. 1A. The TIM 120B is bimetallic foil or film that comprises alternating layers of a first metal 122 and second metal 124. The number of layers and the composition and relative thicknesses of the metals 122, 124 can be chosen to achieve a desired combination of thermal conductivity (measured, for example, in units of Watts per meter per Kelvin, i.e., W/(m)(K)) and CTE which can be measured in relative terms such as percentage change in a dimension per Kelvin (e.g., parts-per-million per Kelvin), or another equivalent system of units. As shown, a TIM such as the TIM 120B may be plated or otherwise coated with other materials on its top and bottom surfaces, such as a metal layer 125a and another metal layer 125b in the example of FIG. 1B. In one or more embodiments, a TIM is plated on both sides with the same metal or other conductive material, while in one or more embodiments, a TIM is plated with a first metal or other conductive material on one side and a different metal or other conductive material on the other side.

As shown in FIG. 1B a free-standing TIM such as the TIM 120B may have a first layer of a first material (e.g., the metal 122) at its top surface and the same material at its bottom surface. The TIM 120B is shown to represent a TIM with alternating layers of two materials. However, nothing herein is intended to limit such a TIM to three layers. For instance, the TIM 120B can represent a TIM having a stack of the form 122/[124/122]$_N$ or 124/[122/124]$_N$ where N is an integer indicating a number of times the layered combination of the metal layer 124 with the metal layer 122 is repeated.

Figure 1C:
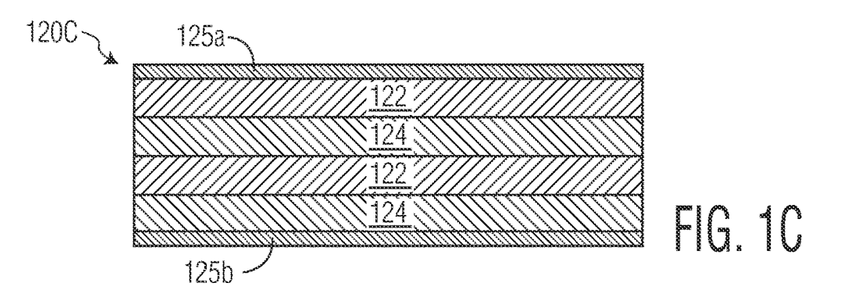
FIG. 1C is a cross-sectional illustration of another heterostructure-based thermal interface suitable for use in one or more embodiments.

Meanwhile, as shown in FIG. 1C a free-standing TIM such as the TIM 120C, also suitable for use as the TIM 120 in FIG. 1A, may have a layer of a first metal at one surface, and a layer of a second metal (e.g., the metal 124) at the opposite surface. As shown, a TIM such as the TIM 120B can be optionally plated or otherwise coated with additional layers at the surfaces (e.g., the layers 125a, 125b). In one or more embodiments, a TIM such as the TIM 120B or the TIM 120C has a total thickness in a range of 100 µm-1000 µm or any intermediate range such as 100-600 µm as one nonlimiting example. In one or more embodiments, a metal layer such as the metal layer 122 is copper or an alloy containing copper. In one or more embodiments, a metal layer such as the metal layer 124 is molybdenum or an alloy containing molybdenum. The TIM 120C is shown to represent a TIM with alternating layers of two materials. However, nothing herein is intended to limit such a TIM to three layers. For instance, the TIM 120C can represent a TIM having a stack of the form 122/[124/122]$_N$/124 or 124/[122/124]$_N$/122 where N is an integer greater or equal to zero indicating a number of times the layered combination of the metal layer 124 with the metal layer 122 is repeated.

Figure 1D:
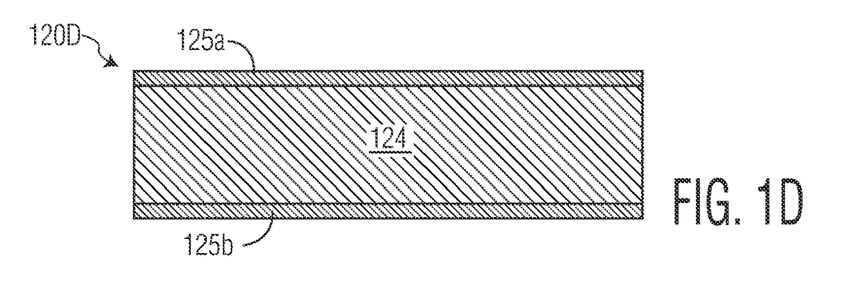
FIG. 1D is a cross-sectional illustration of another heterostructure-based thermal interface suitable for use in one or more embodiments.

As shown in FIG. 1D a heterostructure TIM such as the TIM 120D may also be used as a TIM in one or more embodiments. For example, a single layer of the metal layer 124 (e.g., molybdenum) may be plated otherwise coated with additional conductive layers 125a, 125b as shown. In one or more embodiments a TIM such as the TIM 120D may have a thickness that is greater or equal to approximately 25 µm.

Figure 1E:
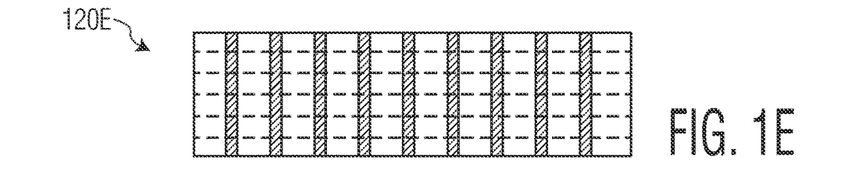
FIG. 1E is a cross-sectional illustration of another heterostructure-based thermal interface suitable for use in one or more embodiments.

As shown in FIG. 1E a heterostructure TIM such as the TIM 120E may also be used as a TIM in one or more embodiments. For example, the TIM 120E may be formed from planes of highly-oriented pyrolytic graphite (HOPG) oriented in a horizontal direction perpendicular to the thickness of the TIM which are penetrated by a second conductive material in a vertical direction parallel to the thickness of the film. Alternatively, a TIM such as the TIM 120E may be formed by truncated HOPG planes oriented vertically which are penetrated by a second conductive material along the horizontal direction since it will be appreciated that HOPG has high conductivity in the plane of each graphene sheet but significantly lower conductivity in between distinct planes.

It will be appreciated that material compositions, thicknesses and other characteristics of materials forming a TIM according to one or more embodiments can be chosen to achieve a desired aggregate thermal conductivity and/or coefficient of thermal expansion based on characteristics of the substrate.

It will be further appreciated that nothing herein is intended to limit use of TIMs described herein to a particular package type. For instance, in one or more embodiments, a package may include an air cavity. Further in one or more embodiments, such a package may include a die such as the die 110 or other die described herein bonded to a leadframe acting as a flange such as the flange 140.

FIG. 2 illustrates steps in an example process for fabricating a package such as the package 100 according to one or more embodiments. The steps 210, 220, 230, 240, and 250 of the process 400 are illustrated and described with reference to the package 100 and the components shown in FIG. 1A.

First, at step 210, semiconductor substrate 101 is provided. As shown, in one or more embodiments, the semiconductor substrate has a backside metallization layer 102. As shown, the substrate 101 can be diced later to produce multiple die 110.

At step 220, a freestanding TIM (e.g., the TIM 120 as shown) is metallurgically bonded to the bottom surface of the substrate 101 via a die attach material 103. In one or more embodiments the die attach material 103 is a sintering material (e.g., a silver sinter power or a silver sinter paste). In one or more embodiments as shown in FIG. 2, a TIM such as the TIM 120 is bonded to a substrate such as the substrate 101 prior to singulation of the substrate into individual die such as the die 110. In one or more such embodiments, a film-based sintering material is used.

In one or more embodiments, the die attach material 103 is a soldering material such as a gold-tin soldering material. It will be appreciated that the die attach material 103 may be chosen for a particular application or process based on various considerations including a desired processing temperature. For instance, it will be appreciated that a sintering material may form a metallurgical bond between two surfaces at lower temperatures than some soldering materials. As a further example, a silver-sintering process may be performed at approximately 250° C. while a soldering processing using an 80%/20% composition of gold/tin may require a temperature of 300° C. As another nonlimiting example a silver sintering process may be performed at lower temperature such as 175° C. under increased bonding pressure.

At step 230, the semiconductor substrate 101 with the TIM 120 metallurgically bonded to it as shown is singulated into individual die 110, each with a corresponding portion of the TIM 120 metallurgically bonded to the bottom surface 114 of that die 110 as shown in FIG. 1A.

At step 240, the flange 140 is prepared for bonding with the die 110 (via the bottom surface of the TIM 120) by application of the die attach material 130 to the top surface of the flange 140. As nonlimiting examples, the die attach material 130 may be a powder-based silver sintering material or a paste-based silver sintering material. In one or more embodiments, a solder material such as a solder preform or other suitable soldering material may be used.

Finally, at step 250, an individual die 110 is metallurgically bonded to the flange 140 by via the die attach material 130. The die 110 (with the TIM 120 bonded to it as shown can be pressed into the die attach material 130 and the parts may be heated until they are sintered together.

It will be appreciated that processes such as the process 200 according to embodiments herein can confer various advantages in different applications. As one example, a semiconductor substrate such as the substrate 101 and the die 110 can be fabricated independently of the TIM 120 which may have less stringent processing requirements than the die 110 (e.g., the die 110 may need to be fabricated using high vacuum (HV) or ultra-high vacuum (UHV) processing steps. As another example, forming a TIM such as the TIM 120 in-situ during fabrication of a die such as the die 110 may be undesirable due to the risk of unwanted diffusion of material from the TIM into the die during deposition processes that may involve elevated temperature or atoms impinging on the die 110 with high kinetic energy. It will be further appreciated that use of a freestanding foil or similar structure as a TIM as described herein can also alloy for a greater range of thicknesses than can be practically achieved using in-situ deposition processes.

Figure 3:
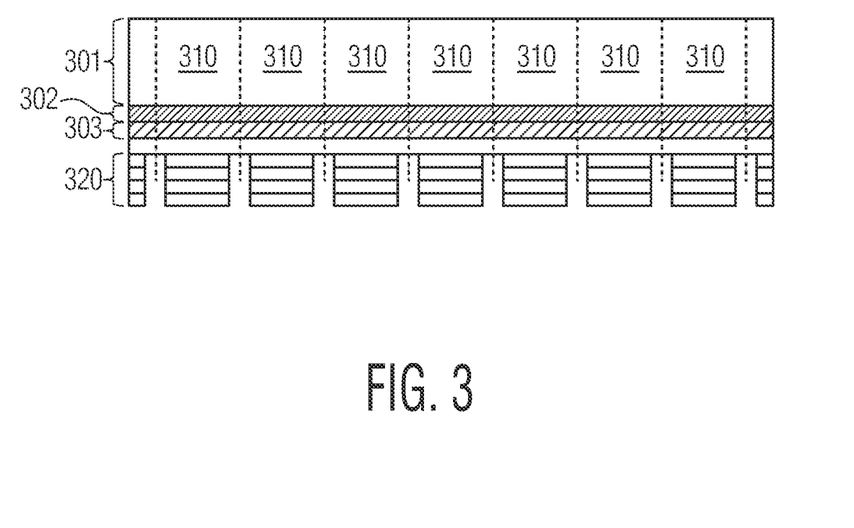
FIG. 3 is a cross sectional illustration of another heterostructure thermal interface material that is modified to facilitate a semiconductor dicing process according to one or more embodiments.

In one or more embodiments a free-standing TIM may be modified to aid in the process of singulation of a substrate (e.g., singulation of the substrate 301, or the substrate 101 via any suitable wafer dicing process) into individual die (e.g., die 310, die 110). The TIM 320 may be the same as any TIM suitable for use as a TIM such as the TIM 120 as described above with the exception that it has been partially singulated as shown using any suitable process including partial depth dicing with a wafer dicing saw, partial depth dicing via water jet, partial depth dicing using a laser or any other suitable process.

In one or more embodiments, a top layer of a heterostructure TIM (e.g., the metal layer 122 of the TIM 120B or the TIM 120C) has a first CTE and an adjoining layer (e.g., the metal layer 124 of the TIM 120B or the TIM 120C) and the first CTE is closer to a CTE of the substrate or die (e.g., the substrate 101/301 and/or the die 110/310) than the second CTE. In other words, for a given set of layers in a TIM according to one or more embodiments, the ordering of layers in a TIM may be chosen to minimize CTE mismatch at the interface between the substrate and the layer of the TIM closest to substrate.

In one or more embodiments, a bottom layer of a heterostructure TIM (e.g., a metal layer 124 of the TIM 120B or the TIM 120C) has the second CTE and an adjoining layer (e.g., a metal layer 122 of the TIM 120B or the TIM 120C) and the second CTE is closer to a CTE of the flange (e.g., the flange 140) than the first CTE. In other words, for a given set of layers in a TIM according to one or more embodiments, the ordering of layers in a TIM may be chosen to minimize CTE mismatch at the interface between the flange and the bottom layer of the TIM closest to the flange.

In one or more embodiments, the overall CTE of a TIM is similar the CTE of a substrate to which it is bonded and/or a flange to which it is bonded. For example, in one or more embodiments, the CTE of a TIM is less than six times larger than a CTE of the substrate. In or more embodiments, the CTE of a flange is less than the four times greater than the CTE of TIM.

VARIOUS EXAMPLES

Features of embodiments may be understood by way of one or more of the following examples:

Example 1: a method or device in which a semiconductor substrate having a top surface and a bottom surface is metallurgically bonded a top surface of a freestanding heterostructure thermal interface material to the bottom surface. In this example, the semiconductor substrate is coupled to a metallic flange having a top surface disposed beneath the semiconductor device die by metallurgical bonding of a bottom surface of the heterostructure thermal interface material to the metallic flange via a layer of die-attach material. The heterostructure thermal interface comprises a volume of a first conductive material and a volume of second conductive material that is physically distinct from the first volume of conductive material.

Example 2: the method or device of Example 1, in which the top surface of the heterostructure thermal interface is plated with a first metal plating layer prior to being metallurgically bonded to the bottom surface of the semiconductor substrate.

Example 3: The method or device of Example 1 or Example 2 in which the bottom surface of the heterostructure thermal interface material is plated with a second metal plating layer prior to being metallurgically bonded to the bottom surface of the semiconductor substrate.

Example 4: The method or device of any of Examples 1-3 in which the bottom surface of the semiconductor substrate includes a backside metallization layer.

Example 5: The method or device of any of Examples 1-4, in which the heterostructure thermal interface material comprises alternating layers of copper and molybdenum.

Example 6: The method or device of any of Examples 1-5, in which the heterostructure thermal interface material comprises: one more layers that include tungsten; one or more layers that include a copper-tungsten alloy; one or more silicon-carbide layers; a copper-containing portion and a graphite portion; or a silver-containing portion and a diamond-containing portion.

Example 7: The method or device of any of Examples 1-6, in which the heterostructure thermal interface material comprises alternating layers of distinct materials configured and arranged such that the heterostructure thermal interface material has a coefficient of thermal expansion that is similar to a coefficient of thermal expansion of the semiconductor substrate.

Example 8: The method or device of any of Examples 1-7, in which the heterostructure thermal interface material comprises a bimetallic foil that has a coefficient of thermal expansion that is less than 15 parts-per-million per Kelvin.

Example 9: The method or device of any of Examples 1-8, in which the bimetallic foil has a thickness in a range between 100 μm and 1000 μm.

Example 10: The method or device of any of Examples 1-9, in which the heterostructure thermal interface material comprises a molybdenum foil having a thickness greater or equal to 25 μm that is plated with another metal.

Example 11: The method or device of any of Examples 1-10, in which the heterostructure thermal interface material comprises a tungsten foil having a thickness greater or equal to 25 μm that is plated with another metal.

Example 12: The method or device of any of Examples 1-11, in which the heterostructure thermal interface material comprises a first particulate material in a conductive matrix formed from a second material.

Example 13: The method or device of any of Examples 1-12, in which the heterostructure thermal interface material comprises layers of highly-ordered pyrolytic graphite in contact with a second conductive material.

Example 14: The method or device of any of Examples 1-13, in which the top surface of the thermal interface material is metallurgically bonded to the bottom surface of the semiconductor substrate using a film-based sintering material.

Example 15: The method or device of any of Examples 1-14, in which the film-based sintering material is a silver sintering material.

Example 16: The method or device of any of Examples 1-15, in which the semiconductor substrate is a device die separated from a larger substrate. In this example the device die is separated by dicing the larger substrate after bonding the top surface of the heterostructure thermal interface material to the semiconductor substrate.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising,"

or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A method comprising:
   receiving a semiconductor substrate having a top surface and a bottom surface;
   metallurgically bonding a top surface of a freestanding heterostructure thermal interface material to the bottom surface of the semiconductor substrate;
   separating a semiconductor device die from the semiconductor substrate after bonding the top surface of the freestanding heterostructure thermal interface material to the bottom surface of the semiconductor substrate, wherein a portion of the freestanding heterostructure thermal interface material remains metallurgically bonded to a bottom surface of the device die; and
   coupling the semiconductor device die to a metallic flange having a top surface disposed beneath the semiconductor device die by metallurgically bonding a bottom surface of the heterostructure thermal interface material to the metallic flange via a layer of die-attach material;
   wherein the heterostructure thermal interface comprises a volume of a first conductive material and a volume of second conductive material that is physically distinct from the first volume of conductive material;
   wherein the heterostructure thermal interface material comprises a bimetallic foil that has a coefficient of thermal expansion that is less than 15 parts-per-million per Kelvin.

2. The method of claim 1, further comprising plating the top surface of the heterostructure thermal interface material with a first metal plating layer prior to metallurgically bonding the top surface of a heterostructure thermal interface material to the bottom surface of the semiconductor substrate.

3. The method of claim 2, further comprising plating the bottom surface of the heterostructure thermal interface material with a second metal plating layer prior to metallurgically bonding the top surface of a heterostructure thermal interface material to the bottom surface of the semiconductor substrate.

4. The method of claim 1, wherein the bottom surface of the semiconductor substrate includes a backside metallization layer.

5. The method of claim 1, wherein the heterostructure thermal interface material comprises alternating layers of copper and molybdenum.

6. The method of claim 1, wherein the heterostructure thermal interface material comprises:
   one or more layers that include tungsten;
   one or more layers that include a copper-tungsten alloy;
   one or more silicon-carbide layers;
   a copper-containing portion and a graphite portion; or
   a silver-containing portion and a diamond-containing portion.

7. The method of claim 1, wherein the heterostructure thermal interface material comprises alternating layers of distinct materials configured and arranged such that the heterostructure thermal interface material has a coefficient of thermal expansion that is similar to a coefficient of thermal expansion of the semiconductor substrate.

8. A method comprising:
   receiving a semiconductor substrate having a top surface and a bottom surface;
   metallurgically bonding a top surface of a freestanding heterostructure thermal interface material to the bottom surface of the semiconductor substrate; and
   coupling the semiconductor substrate to a metallic flange having a top surface disposed beneath the semiconductor substrate by metallurgically bonding a bottom surface of the heterostructure thermal interface material to the metallic flange via a layer of die-attach material;
   wherein the heterostructure thermal interface comprises a volume of a first conductive material and a volume of second conductive material that is physically distinct from the first volume of conductive material;
   wherein the heterostructure thermal interface material comprises alternating layers of distinct materials configured and arranged such that the heterostructure thermal interface material has a coefficient of thermal expansion that is similar to a coefficient of thermal expansion of the semiconductor substrate; and wherein the heterostructure thermal interface material comprises a bimetallic foil that has a coefficient of thermal expansion that is less than 15 parts-per-million per Kelvin.

9. The method of claim 8, wherein the bimetallic foil has a thickness of at least 100 μm and less than 200 82 m.

10. The method of claim 1, wherein the heterostructure thermal interface material comprises a molybdenum foil having a thickness greater or equal to 25 um that is plated with another metal.

11. The method of claim 1, wherein the heterostructure thermal interface material comprises a tungsten foil having a thickness greater or equal to 25 μm that is plated with another metal.

12. The method of claim 1, wherein the heterostructure thermal interface material comprises a first particulate material in a conductive matrix formed from a second material.

13. The method of claim 1, wherein the heterostructure thermal interface material comprises layers of highly-ordered pyrolytic graphite in contact with a second conductive material.

14. The method of claim 1, wherein the top surface of the thermal interface material is metallurgically bonded to the bottom surface of the semiconductor substrate using a film-based sintering material.

15. The method of claim 14, wherein the film-based sintering material is a silver sintering material.

16. The method of claim 8, wherein the semiconductor substrate is a device die separated from a larger substrate; and
wherein the method further comprises dicing the larger substrate to separate the device die and an additional device die from the larger substrate after bonding the top surface of the heterostructure thermal interface material to the semiconductor substrate.

17. A device comprising:
a semiconductor substrate having a top surface and a bottom surface;
a heterostructure thermal interface material metallurgically bonded to the bottom surface of the semiconductor substrate;
a metallic flange having a top surface disposed beneath the semiconductor substrate that is metallurgically bonded to a bottom surface of the heterostructure thermal interface material via a layer of die-attach material;
wherein the heterostructure thermal interface comprises a volume of a first conductive material and a volume of second conductive material that is physically distinct from the first volume of conductive material;

wherein the top surface of the heterostructure thermal interface material is plated with a first metal plating layer that is metallurgically bonded to the top to the bottom surface of the semiconductor substrate
wherein the bottom surface of the heterostructure thermal interface material is plated with a second metal plating layer that is metallurgically bonded to the bottom surface of the semiconductor substrate
wherein the bottom surface of the semiconductor substrate includes a backside metallization layer; and
wherein the heterostructure thermal interface material comprises a bimetallic foil that has a coefficient of thermal expansion between that is less than 15 parts-per-million per Kelvin.

18. The device of claim 17, wherein the heterostructure thermal interface material comprises alternating layers of copper and molybdenum.

19. The device of claim 17, wherein the heterostructure thermal interface material comprises:
one more layers that include tungsten;
one or more layers that include a copper-tungsten alloy;
one or more silicon-carbide layers;
a copper-containing portion and a graphite portion; and/or
a silver-containing portion and a diamond-containing portion.

20. The device of claim 17, wherein the bimetallic foil has a thickness in a range between 100 μm and 1000 μm.

21. The device of claim 17, wherein the heterostructure thermal interface material comprises a molybdenum foil having a thickness greater or equal to 25 μm that is plated with another metal.

22. The device of claim 17, wherein the heterostructure thermal interface material comprises a tungsten foil having a thickness greater or equal to 25 μm that is plated with another metal.

23. The device of claim 17, wherein the heterostructure thermal interface material comprises a first particulate material in a conductive matrix formed from a second material.

24. The method of claim 17, wherein the heterostructure thermal interface material comprises layers of highly-ordered pyrolytic graphite in contact with a second conductive material.

25. The device of claim 17, the top surface of the thermal interface material is metallurgically bonded to the bottom surface of the semiconductor substrate using a film-based sintering material.

26. The device of claim 25, wherein the film-based sintering material is a silver sintering material.

* * * * *